(12) United States Patent
Lee et al.

(10) Patent No.: US 8,128,749 B2
(45) Date of Patent: Mar. 6, 2012

(54) FABRICATION OF SOI WITH GETTERING LAYER

(75) Inventors: Junedong Lee, Hopewell Junction, NY (US); Devendra K. Sadana, Pleasantville, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1029 days.

(21) Appl. No.: 11/867,235

(22) Filed: Oct. 4, 2007

(65) Prior Publication Data

US 2009/0092810 A1   Apr. 9, 2009

(51) Int. Cl.
*C30B 21/02* (2006.01)

(52) U.S. Cl. ............... 117/84; 117/90; 117/91; 117/94; 117/95

(58) Field of Classification Search ............. 117/84, 117/90, 91, 94, 95
See application file for complete search history.

(56) References Cited

U.S. PATENT DOCUMENTS

| | | | |
|---|---|---|---|
| 3,689,357 A | 9/1972 | Jordan | |
| 5,017,998 A | 5/1991 | Miura et al. | |
| 5,374,564 A | 12/1994 | Bruel | |
| 5,969,923 A | 10/1999 | Avery | |
| 6,433,391 B1 | 8/2002 | En et al. | |
| 6,541,348 B1 | 4/2003 | Nakajima | |
| 6,544,656 B1 | 4/2003 | Abe et al. | |
| 6,548,382 B1 | 4/2003 | Henley et al. | |
| 6,563,172 B2 | 5/2003 | Yoshida et al. | |
| 6,569,749 B1 | 5/2003 | Wijaranakula et al. | |
| 6,635,517 B2 | 10/2003 | Chen et al. | |
| 6,670,259 B1 | 12/2003 | Chan | |
| 6,696,352 B1 | 2/2004 | Carr et al. | |
| 6,774,435 B1 | 8/2004 | Matsumoto et al. | |
| 6,774,454 B2 | 8/2004 | Hirabayashi | |
| 6,830,986 B2 | 12/2004 | Yamashita et al. | |
| 6,872,979 B2 | 3/2005 | Yoshida et al. | |
| 6,890,838 B2 | 5/2005 | Henley et al. | |
| 6,929,984 B2 | 8/2005 | Forbes et al. | |
| 6,946,711 B2 | 9/2005 | Suzuki et al. | |
| 7,183,179 B2 | 2/2007 | Droes et al. | |
| 7,202,124 B2 | 4/2007 | Fitzgerald et al. | |
| 2003/0139022 A1* | 7/2003 | Malone | 438/476 |
| 2006/0258063 A1* | 11/2006 | Forbes | 438/149 |
| 2007/0257249 A1* | 11/2007 | Mocuta et al. | 257/19 |

* cited by examiner

*Primary Examiner* — Bob M Kunemund
(74) *Attorney, Agent, or Firm* — Yuanmin Cai; Howard Cohn (57) ABSTRACT

An SOI substrate has a gettering layer of silicon-germanium (SiGe) with 5-10% Ge, and a thickness of approximately 50-1000 nm. Carbon (C) may be added to SiGe to stabilize the dislocation network. The SOI substrate may be a SIMOX SOI substrate, or a bonded SOI substrate, or a seeded SOI substrate. The gettering layer may disposed under a buried oxide (BOX) layer. The gettering layer may be disposed on a backside of the substrate.

9 Claims, 6 Drawing Sheets

FIG. 1A
SiGe Deposition

FIG. 1B
Si Epi ~2um

FIG. 1C
O+ implant

FIG. 1D
High Temp Anneal

FIG. 2A
SiGe Deposition

FIG. 2B
Invert Substrate

FIG. 2C
O+ implant

FIG. 2D
High Temp Anneal

FIG. 3A
SOI (top) Substrate
Oxidation and H+ Implant

FIG. 3B
Invert SOI Substrate

FIG. 3C
Support (bottom) Substrate
SiGe epi

FIG. 3D
Bonding and Splitting

FIG. 4A
SOI (top) Substrate
Oxidation and H+ Implant

FIG. 4B
Invert SOI Substrate

FIG. 4C
Support (bottom) Substrate
SiGe epi

FIG. 4D
Invert Bottom Substrate
Bonding and Splitting

FIG. 5A
SiGe Deposition

FIG. 5B
Si Epi ~1um

FIG. 5C
Oxidation or dielectric layer deposition

FIG. 5D
Seeding, Si EPI, and Anneal

FIG. 6A
SiGe Deposition

FIG. 6B
Oxidation or dielectric layer deposition

FIG. 6C
Seeding, Si EPI, and Anneal

FABRICATION OF SOI WITH GETTERING LAYER

FIELD OF THE INVENTION

The invention relates to silicon-on-insulator (SOI) wafers and, more particularly, to SOI substrates incorporating a gettering layer.

BACKGROUND OF THE INVENTION

Silicon on insulator technology (SOI) refers to the use of a layered silicon-insulator-silicon substrate in place of conventional silicon substrates in semiconductor manufacturing, especially microelectronics. SOI-based devices differ from conventional silicon-built devices in that the silicon junction is above an electrical insulator, typically silicon dioxide or (less commonly) sapphire. The choice of insulator depends largely on intended application, with sapphire being used for radiation-sensitive applications and silicon oxide preferred for improved performance and diminished short channel effects in microelectronics devices. The precise thickness of the insulating layer and topmost silicon layer also vary widely with the intended application.

Reported benefits of SOI technology relative to conventional silicon (bulk CMOS) processing include:
  Lower parasitic capacitance due to isolation from the bulk silicon, which improves power consumption at matched performance.
  Resistance to latchup due to complete isolation of the n- and p-well structures.

From a manufacturing perspective, SOI substrates are compatible with most conventional fabrication (fab) processes. In general, an SOI-based process may be implemented without special equipment or significant retooling of an existing factory. Among challenges unique to SOI are novel metrology requirements to account for the buried oxide layer and concerns about differential stress in the topmost silicon layer.

SiO2-based SOI substrates (or wafers) can be produced by several methods:
  SIMOX—Separation by IMplantation of OXygen—uses an oxygen ion beam implantation process followed by high temperature annealing to create a buried SiO2 layer.
  Wafer Bonding—the insulating layer is formed by directly bonding oxidized silicon with a second substrate. The majority of the second substrate is subsequently removed, the remnants forming the topmost Si layer.
  Seed methods—wherein the topmost Si layer is grown directly on the insulator. Seed methods require some sort of template for homoepitaxy, which may be achieved by chemical treatment of the insulator, an appropriately oriented crystalline insulator, or vias through the insulator from the underlying substrate.

One type of SOI wafer comprises a thin layer of single crystalline silicon extending over and insulated from the surface of a silicon substrate, and is called a "SIMOX" device. Circuits are formed in the thin layer of silicon by forming various electrical components, such as transistors, in the thin layer. One method of making a SIMOX device is to implant oxygen ions into the surface of a substrate of single crystalline silicon so that the oxygen ions are spaced from the surface of the substrate. The substrate is then heated so that the oxygen ions react with the silicon and form a thin layer of silicon dioxide beneath the surface of the substrate with a thin layer of the silicon extending over the oxide layer. See, for example, U.S. Pat. No. 5,969,923, incorporated by reference herein.

Another type of SOI wafer comprises two wafers bonded together, a first silicon substrate (or wafer) which has an oxide layer formed upon a surface thereof, which is bonded, face-to-face, with another silicon substrate (or wafer) which provides support, resulting in a silicon-oxide-silicon structure. Then, the majority of one (or the other) of the two substrates is removed, such as by backlapping, leaving a thin layer of silicon wherein circuits may be formed by forming various electrical components, such as transistors, in the thin layer. See, for example, U.S. Pat. Nos. 3,689,357 and 5,374,564.

Metallic contamination is one of the major concerns in semiconductor manufacturing. Sources of metallic contamination can include furnace anneal, chemical mechanical polishing (CMP), and wafer handling generally. Reactive and fast diffusing metal ions can cause excessive junction leakage, or even shorts, which are detrimental to the chip performance and yield. In Silicon-on-Insulator (SOI), it is particularly important to keep the metallic contamination level down, since they are easily gettered at the SOI and buried oxide (BOX) interface or BOX/substrate interface, which are very close to the active device area. A polysilicon (poly-Si) crystal layer deposited on the wafer backside has been used as a gettering layer for several years. However, the rough surface of the poly-Si layer degrades wafer flatness, which is not desirable for submicron lithography. The rough surface of the poly-Si layer may also trap or shed particles during the device processes.

RELATED PATENTS AND PUBLICATIONS

The following patents are incorporated by reference in their entirety herein.

U.S. Pat. No. 7,202,124 discloses strained gettering layers for semiconductor processes. A method and structure for forming semiconductor structures using tensilely strained gettering layers. The method includes forming a donor wafer comprising a tensilely strained gettering layer disposed over a substrate, and at least one material layer disposed over the tensilely strained gettering layer. Additionally, the donor wafer may possess a particle-confining region proximate the tensilely strained layer. The method also includes introducing particles into the donor wafer to a depth below the surface, and accumulating at least some particles within the tensilely strained gettering layer. Next, the method includes initiating a cleaving action so as to separate at least one of the material layers form the substrate. The tensilely strained gettering layer may accumulate particles and/or point defects and reduce the implantation dose and thermal budget required for cleaving.

U.S. Pat. No. 7,183,179 discloses system and method for hydrogen exfoliation gettering. A hydrogen (H) exfoliation gettering method is provided for attaching fabricated circuits to receiver substrates. The method comprises: providing a Si substrate; forming a Si active layer overlying the substrate with circuit source/drain (S/D) regions; implanting a p-dopant into the S/D regions; forming gettering regions underling the S/D regions; implanting H in the Si substrate, forming a cleaving plane (peak concentration (Rp) H layer) in the Si substrate about as deep as the gettering regions; bonding the circuit to a receiver substrate; cleaving the Si substrate along the cleaving plane; and binding the implanted H underlying the S/D regions with p-dopant in the gettering regions, as a result of post-bond annealing.

U.S. Pat. No. 6,946,711 discloses semiconductor device. In a semiconductor device such as MOSFET, a single crystal semiconductor substrate is provided. An epitaxial layer is formed on the single crystal semiconductor substrate. A p-well regions are formed on the epitaxial layer, respectively, and n+ source regions are formed on the p-well regions, respectively. A gate electrode is formed through a gate insulation film on a part of each p-well region and that of each n+ source region. The gate electrode is covered with an insulation film. On the insulation film, a source electrode is formed so that the n-channel MOSFET includes body diodes BD imbedded therein. A drain electrode is formed on the single crystal semiconductor substrate. A cluster-containing layer is implanted in the single crystal semiconductor substrate as a gettering layer so that the cluster-containing layer contains a cluster of nitrogen.

U.S. Pat. No. 6,929,984 discloses gettering using voids formed by surface transformation. One aspect of this disclosure relates to a method for creating a gettering site in a semiconductor wafer. In various embodiments, a predetermined arrangement of a plurality of holes is formed in the semiconductor wafer through a surface of the wafer. The wafer is annealed such that the wafer undergoes a surface transformation to transform the arrangement of the plurality of holes into a predetermined arrangement of at least one empty space of a predetermined size within the wafer to form the gettering site. One aspect relates to a semiconductor wafer. In various embodiments, the wafer includes at least one device region, and at least one gettering region located proximate to the at least one device region. The gettering region includes a precisely-determined arrangement of a plurality of precisely-formed voids that are formed within the wafer using a surface transformation process. Other aspects and embodiments are provided herein.

U.S. Pat. No. 6,890,838 discloses a gettering technique for wafers made using a controlled cleaving process. A technique for forming a gettering layer in a wafer made using a controlled cleaving process. The gettering layer can be made by implanting using beam line or plasma immersion ion implantation, or made by forming a film of material such as polysilicon by way of chemical vapor deposition. A controlled cleaving process is used to form the wafer, which is a multi-layered silicon on insulator substrate. The gettering layer removes and/or attracts impurities in the wafer, which can be detrimental to the functionality and reliability of an integrated circuit device made on the wafer.

U.S. Pat. No. 6,872,979 discloses a semiconductor substrate with stacked oxide and SOI layers with a molten or epitaxial layer formed on an edge of the stacked layers. A semiconductor substrate that prevents formation of particles from an edge part of the substrate. The substrate contains an on-substrate oxide film and an SOI layer stacked on the oxide film. A molten layer is formed on the edge part of the on-substrate oxide film and the SOI layer by mixing the SOI layer and the on-substrate oxide film to cover the edge part. An epitaxial layer may also be formed on the edge part of the on-substrate oxide film and the SOI layer to cover the edge part.

U.S. Pat. No. 6,830,986 discloses SOI semiconductor device having gettering layer and method for producing the same. An SOI semiconductor device includes at least an SOI substrate including an insulating film and a semiconductor layer formed on the insulating film; and an active semiconductor element formed on the semiconductor layer. The active semiconductor element is formed in an element formation region surrounded by an isolating region for isolating the semiconductor layer in a form of an island. A gettering layer containing a high concentration impurity is formed in a portion of the semiconductor layer excluding the element formation region in which the active semiconductor element is formed, and the gettering layer is not formed in the element formation region in which the active semiconductor element is formed.

U.S. Pat. No. 6,774,454 discloses semiconductor device with an silicon insulator (SOI) substrate. A semiconductor and a method of manufacturing thereof form a region with a sufficient gettering effect. A p-type channel MOSFET and an n-type channel MOSFET are formed in an n-type semiconductor layer, which is isolated in a form of islands on an SOI substrate. A high-concentration impurity diffused region is formed in such a manner as to surround the p-type channel MOSFET and the n-type channel MOSFET. The high-concentration impurity diffused region has a surface concentration of between $1\times10^{18}$ atom/cm$^3$ and $5\times10^{20}$ atom/cm$^3$ for achieving a desired gettering effect.

U.S. Pat. No. 6,774,435 discloses semiconductor wafer and semiconductor device comprising gettering layer. A semiconductor wafer includes an oxide film above a silicon layer, and a porous silicon layer which is located above the oxide film and serves as a gettering layer. Gettering of impurities from a silicon layer is not interrupted by the oxide film since the porous silicon layer is placed above the oxide film. The semiconductor wafer having the structure above can be produced by a bonding method. Bonding strength relative to the oxide film is ensured by placing a growth silicon layer between the oxide film and the porous silicon layer, compared with the case in which the oxide film and the porous silicon layer are directly bonded.

U.S. Pat. No. 6,696,352 discloses a method of manufacture of a multi-layered substrate with a thin single crystalline layer and a versatile sacrificial layer. A process for producing a multilayered substrate. In a first step, an adhesive layer is applied to a surface of a support substrate. Then a device substrate is placed into contact with the adhesive surface. Then the adhesive is cured. Then the device substrate is thinned. The device substrate has a hydrogen trap layer inside. The trap layer is formed by ion implantation through a face surface of the device substrate. The adhesive is chosen from compounds that release hydrogen upon curing. Thinning of the device substrate is performed by cleavage along a fragile layer of hydrogen microbubbles. The microbubble layer is formed through gettering of hydrogen released from the adhesive layer upon curing onto the trap layer and evolving the trapped hydrogen into the microbubbles. The substrates are preferably silicon single crystalline wafers and the adhesive is preferably hydrogen-silsesquioxane. The process is preferentially used to manufacture silicon-on-adhesive wafers for microelectromechanical systems, multilayer CMOS, and optoelectronic applications. The layered wafers have one or more thin single crystalline device layers and one or more sacrificial/spacer layer.

U.S. Pat. No. 6,670,259 discloses inert atom implantation method for SOI gettering. A method of manufacturing a silicon-on-insulator substrate, comprises the steps of (1) providing a silicon-on-insulator semiconductor wafer having at least one surface of a silicon film; (2) implanting an inert atom into the at least one surface to form a damaged surface layer including a gettering site on the silicon film and to leave an undamaged region of the silicon film; (3) subjecting the wafer to conditions to getter at least one impurity from the silicon film into the gettering site; and (4) removing the damaged surface layer.

U.S. Pat. No. 6,635,517 discloses use of disposable spacer to introduce gettering in SOI layer. A method of forming a self-aligned gettering region within an SOI substrate is provided. Specifically, the method includes the steps of forming a disposable spacer on each vertical sidewall of a patterned gate stack region, the patterned gate stack region being formed on a top Si-containing layer of an SOI substrate; implanting gettering species into the top Si-containing layer not protected by the disposable spacer and patterned gate stack region; and removing the disposable spacer and annealing the implanted gettering species so as to convert said species into a gettering region.

U.S. Pat. No. 6,569,749 discloses silicon and oxygen ion co-implanation for metallic gettering in epitaxial wafers. A method of generating intrinsic gettering sites in epitaxial wafers employs co-implanting silicon and oxygen into a substrate of the wafer, annealing the substrate at a low temperature, and then depositing the epitaxial layer on a surface of the substrate. The epitaxial deposition acts as an in-situ anneal to form dislocation loops that act as gettering sites. Oxygen precipitate clusters form during the method, which clusters act to anchor the dislocation loops and prevent them from gliding to the wafer surface over time.

U.S. Pat. No. 6,563,172 discloses semiconductor substrate processing method. An object is to provide a semiconductor substrate processing method and a semiconductor substrate that prevent formation of particles from the edge part of the substrate. Silicon ions are implanted into the edge part of an SOI substrate (10) in the direction of radiuses of the SOI substrate (10) to bring a buried oxide film (2) in the edge part of the SOI substrate (10) into a silicon-rich state. Thus an SOI substrate (100) is provided, where the buried oxide film (2) has substantially been eliminated in the edge part.

U.S. Pat. No. 6,548,382 discloses a technique for forming a gettering layer in a wafer made using a controlled cleaving process. The gettering layer can be made by implanting using beam line or plasma immersion ion implantation, or made by forming a film of material such as polysilicon by way of chemical vapor deposition. A controlled cleaving process is used to form the wafer, which is a multilayered silicon on insulator substrate. The gettering layer removes and/or attracts impurities in the wafer, which can be detrimental to the functionality and reliability of an integrated circuit device made on the wafer. As further disclosed therein, in a SOI wafer comprising a lower substrate, an insulating layer, and a film of material which can be a silicon material, a gettering layer can be formed in a region below the insulating layer 14, or be formed in a region 19 in the insulating layer 14, or be formed in a region 21 underlying the active region in the film 16 of silicon material. A variety of techniques can be used to introduce the gettering layer into region 17, 19, or 21. These techniques include, among other, implantation of particles using ion beam implanting or plasma immersion implanting, and film deposition such as chemical vapor deposition and physical vapor deposition. (column 3, lines 35-55).

U.S. Pat. No. 6,544,656 discloses production method for silicon wafer and silicon wafer. A silicon wafer is produced by growing a silicon single crystal ingot having a resistivity of 100 Ω·cm or more and an initial interstitial oxygen concentration of 10 to 25 ppma by the Czochralski method, processing the silicon single crystal ingot into a wafer, and subjecting the wafer to an oxygen precipitation heat treatment so that a residual interstitial oxygen concentration in the wafer should become 8 ppma or less. A silicon wafer produced as described above shows little decrease in resistivity even after a heat treatment in device production etc. Further, if a silicon wafer is produced and heat-treated so that the wafer should have the above-defined initial interstitial oxygen concentration and residual interstitial oxygen concentration, slip dislocations in a subsequent heat treatment process are prevented irrespective of resistivity. Furthermore, by forming an epitaxial layer on a surface of a silicon wafer of the present invention, a high resistivity epitaxial wafer can be produced, which is free from slip dislocations etc. and can be used for various devices.

U.S. Pat. No. 6,541,348 discloses semiconductor device and manufacturing method thereof. Gettering layers are formed near element isolation insulating films in an active layer on a buried oxide film. The gettering layers trap mainly heavy metals diffused from the element isolation insulating films into the active layer.

SUMMARY OF THE INVENTION

To overcome the aforementioned problems associated with the rough surface of a poly-Si gettering layer, it is believed to be desirable to have a flat and smooth gettering layer equivalent to the polished single crystal silicon or to incorporate the gettering layer inside within the wafer (such as between the BOX and the wafer backside).

For purposes of this disclosure, the flatness and smoothness of a polished single crystal silicon wafer is deemed to be flatness<0.15 um SFQR (site flatness), and roughness<1 nm RMS (root mean squared).

It is a general object of the present invention to provide an improved gettering layer in a silicon-on-insulator (SOI) wafer.

According to the invention, generally, silicon-germanium (SiGe) is used as a gettering layer in a silicon-on-insulator (SOI) wafer. SiGe's ability to function as a gettering layer may be due to its misfit dislocation network. Carbon (C) may be added to SiGe to stabilize the dislocation network.

Generally, SiGe is smoother, for example, than polysilicon (poly-Si). Roughness in polysilicon can arise from a growth rate difference from one grain from another grain which are differently oriented. Unlike poly-Si, SiGe is still single crystal.

According to the invention, an SOI substrate comprises: a gettering layer comprising silicon-germanium (SiGe) with 5-10% Ge, and having a thickness of approximately 50-1000 nm. Carbon may be added to the gettering layer. The SOI substrate may be a SIMOX SOI substrate. The gettering layer may disposed under a buried oxide (BOX) layer. The gettering layer may be disposed on a backside of the substrate. The SOI substrate may be a bonded SOI substrate. The gettering layer may disposed under a buried oxide (BOX) layer. The gettering layer may be disposed on a backside of the substrate. The SOI substrate may be a seeded SOI substrate. The gettering layer may disposed under a buried oxide (BOX) layer. The gettering layer may be disposed on a backside of the substrate.

According to the invention, a method of making an SOI substrate comprises: providing a substrate; and epitaxially growing a thin film gettering layer on the substrate, the gettering layer comprising silicon-germanium (SiGe) having 5-10% Ge and a having thickness of approximately 50~1000 nm. Carbon atoms may be added to the SiGe.

In an embodiment, the method may comprise depositing a silicon epi layer over the gettering layer; implanting an oxygen-rich region within the epi layer; and performing annealing.

In an embodiment, the method may comprise inverting the substrate; implanting oxygen in the substrate; and performing annealing.

In an embodiment, the substrate is a "first" substrate, and the method may comprise in a second substrate, oxidizing a top layer of the substrate, and forming a hydrogen-rich separation layer which is below a substrate layer which is below the oxidized top layer; and inverting the second substrate and bonding it face-to-face with the first substrate, splitting the second substrate from the first substrate at the separation layer.

In an embodiment, the substrate is a "first" substrate, and the method may comprise: in a second substrate, oxidizing a top layer of the substrate, and forming a hydrogen-rich separation layer which is below a substrate layer which is below the oxidized top layer; inverting the first substrate; and inverting the second substrate and bonding it face-to-face with the first substrate, splitting the second substrate from the first substrate at the separation layer.

In an embodiment, the method may comprise depositing a silicon epi layer over the gettering layer; forming a dielectric layer over the epi layer; performing seeding, epitaxially growing a layer of silicon over the dielectric layer; and subjecting the substrate to high temperature anneal.

In an embodiment, the method may comprise inverting the substrate; implanting oxygen in the substrate; and performing annealing.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula $SiO_2$. For example, silicon nitride (stoichiometrically $Si_3N_4$, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

In the drawings accompanying the description that follows, often both reference numerals and legends (labels, text descriptions) will be used to identify elements. If legends are provided, they are intended merely as an aid to the reader, and should not in any way be interpreted as limiting.

A SOI wafer generally has a layer of silicon disposed over a layer of buried oxide (BOX) which is disposed over a silicon support substrate. In the discussion that follows, three types of SOI wafers are discussed—(a) SIMOX, (b) Bonded, and (c) Seeded. In the discussion that follows, the creation of a gettering layer in two locations is discussed—(i) under the BOX, and (ii) on the backside of the wafer. Hence, various exemplary embodiments will be discussed, each of which uses a gettering layer comprising silicon-germanium (SiGe). Generally, the exemplary embodiments described herein are:

1. SIMOX—gettering layer under BOX
   Grow SiGe to create misfit dislocation network
   Grow epi Si on SiGe SIMOX implant and anneal
   Refer to FIGS. 1A-1D.
2. SIMOX—gettering layer on backside
   Grow SiGe on backside
   SIMOX implant and anneal
   Refer to FIGS. 2A-2D.
3. Bonded—gettering layer under BOX
   Grow SiGe to create misfit dislocation network on a handle wafer
   H+ implant/Bonding/Splitting/Anneal
   Refer to FIGS. 3A-3D.
4. Bonded—gettering layer on backside
   Deposit SiGe on backside of the handle wafer
   H+ implant/Bonding/Splitting/Anneal
   Refer to FIGS. 4A-4D.
5. Seeded SOI—gettering layer under BOX
   Grow SiGe to create misfit dislocation network
   Grow epi Si on SiGe
   Seeded SOI process
   Refer to FIGS. 5A-5D.
6. Seeded SOI—gettering layer on backside
   Grow SiGe on backside
   Seeded SOI process
   Refer to FIGS. 6A-6C.

A SiGe layer grown (epitaxially) on Si can contain an extensive misfit dislocation network depending on its composition and process conditions. Since such a layer may provide effective gettering sites for metallic ions, the SiGe layer can be used as a gettering layer in SOI wafers. The SiGe layer can be added to the backside of a SOI wafer (2. and 4. and 6., above), or the SiGe layer can be placed under the BOX layer (1. and 3. and 5., above). Carbon atoms may be added to SiGe to stabilize the dislocation network.

Generally, in all of the embodiments disclosed herein, the composition range may be approximately 15-30% Ge, graded or box profile. The process condition (non-selective SiGe) may comprise: Si precursors (Silane, dichlorosilane, disilane or trisilane), Ge precursor (germane, germanium tetra chloride). The growth temperature may be in the range of approximately 500-1100 degree-C. The process pressure may range from milli torr to atmospheric (760 torr). The thickness may range from 1000 Å (Angstrom)-5 μm (micron).

Epitaxy is a kind of interface between a thin film and a substrate. The term epitaxy (Greek; epi "above" and taxis "in ordered manner") describes an ordered crystalline growth on a monocrystalline substrate.

Epitaxial films may be grown from gaseous or liquid precursors. Because the substrate acts as a seed crystal, the deposited film takes on a lattice structure and orientation identical to those of the substrate. This is different from other thin-film deposition methods which deposit polycrystalline or amorphous films, even on single-crystal substrates. If a film is deposited on a substrate of the same composition, the process is called homoepitaxy; otherwise it is called heteroepitaxy.

Homoepitaxy is a kind of epitaxy performed with only one material. In homoepitaxy, a crystalline film is grown on a substrate or film of the same material. This technology is applied to growing a more purified film than the substrate and fabricating layers with different doping levels.

Heteroepitaxy is a kind of epitaxy performed with materials that are different from each other. In heteroepitaxy, a crystalline film grows on a crystalline substrate or film of another material. This technology is often applied to growing crystalline films of materials of which single crystals cannot be obtained and to fabricating integrated crystalline layers of different materials. Examples include gallium nitride (GaN) on sapphire or aluminum gallium indium phosphide (AlGaInP) on gallium arsenide (GaAs).

Generally, circuits and devices (not shown) are formed on the "front" side of an SOI substrate, in an "active" layer of silicon. The opposite side of the substrate is referred to as the "back side" (or "backside").

FIGS. 1A-1D illustrate a sequence of steps (and resulting structures), involved in forming a gettering layer under the buried oxide (BOX) of a SIMOX silicon-on-insulator (SOI) wafer, according to an embodiment of the invention.

Figure 1A:
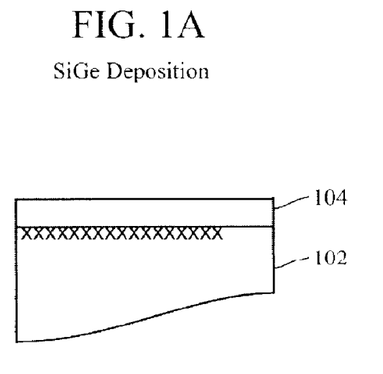
FIGS. 1A-1D are cross-sectional views of an embodiment of the invention.

FIG. 1A illustrates a first step of the process. SiGe is deposited (epitaxially) on a substrate 102, forming a thin film gettering layer 104 on the top surface of the substrate 102. The substrate may comprise a conventional silicon substrate used for semiconductor fabrication, such as n/p type and 200/300 mm. The gettering layer 104 may be formed using a conventional epitaxial process, such as by chemical vapor deposition (CVD), resulting in SiGe with 5-10% Ge, and may have a thickness of approximately 50~1000 nm. Carbon can be added in gas phase during CVD. Generally the deposition process is substantially the same for all embodiments described herein.

Figure 1B:
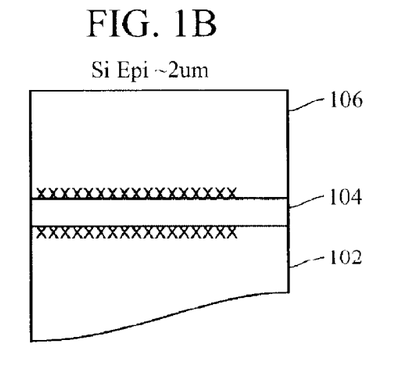

FIG. 1B illustrates a next step of the process. A thick epitaxial (epi) layer 106 of silicon (Si) is deposited, such as using a conventional chemical vapor deposition (CVD), with silicon gas species, resulting in approximately 1~2 μm thickness of single crystalline epi silicon.

Figure 1C:
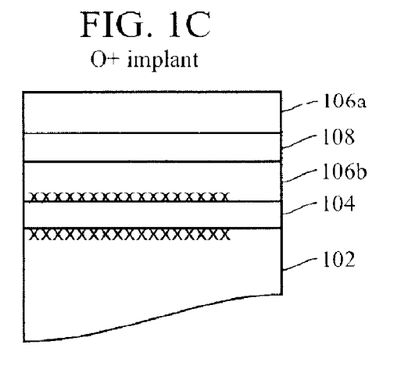
Figure 1D:
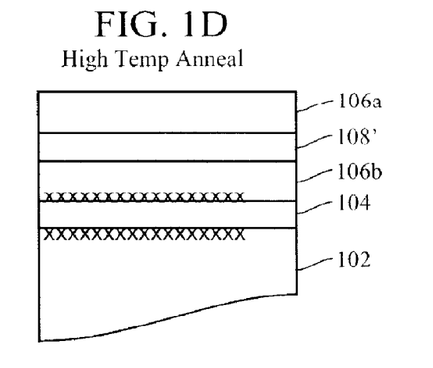

FIG. 1C illustrates a next step of the process. Oxygen (O+) is implanted, using a conventional oxygen ion beam implantation process, to create a buried SiO2 (oxide) layer, or oxygen-rich region 108. The oxide layer 108 is located below the top (as viewed) surface of the overall epi layer 106, within the thick epi layer 106, resulting in a situation where there is a top epi layer 106a, under which is the buried oxide layer 108, under which is a lower epi layer 106b. The top epi layer 106a constitutes the "silicon" of silicon-on-insulator (SOI). The following dimensions are exemplary:
   top epi layer 106a thickness approximately 30-300 nm
   buried oxide layer 108 thickness=approximately 100~1000 nm
   lower epi layer 106b thickness=approximately 1 μm FIG. 1D illustrates a next step of the process. The wafer is subjected to high temperature anneal, such as using a conventional annealing process, resulting in a buried oxide (BOX) layer 108' (prime) which constitutes the "insulator" of silicon-on-insulator (SOI). Note that the gettering layer 104 is disposed in the SOI substrate near the buried oxide layer 108'.

Regarding annealing, the pre-annealed BOX 108 is an implanted area with high level of oxygen and implant damages. During the initial stage of annealing, oxide precipitates nucleate and grow in this area. Extended annealing in oxygen rich ambient promote the diffusion of oxygen into the Si layer and help the oxide precipitates and turn into a single continuous oxide layer. There is a chance that a portion of misfit dislocations gets annihilated during the high temperature annealing. This is a reason that carbon is added (as described hereinabove), to stabilize the misfit dislocations so that they don't get annihilated.

FIGS. 2A-2D illustrate a sequence of steps (and resulting structures), involved in forming a gettering layer on the backside of a SIMOX silicon-on-insulator (SOI) wafer, according to an embodiment of the invention.

Figure 2A:
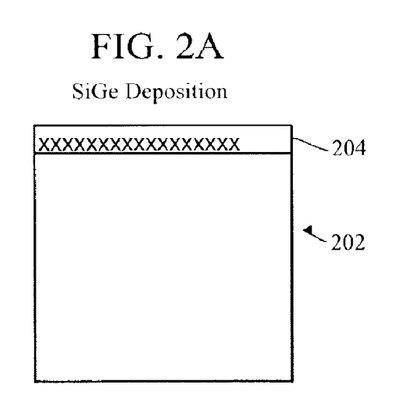
FIGS. 2A-2D are cross-sectional views of an embodiment of the invention.

FIG. 2A illustrates a first step of the process. SiGe is deposited (epitaxially) on a substrate 202 (compare 102), forming a gettering layer 204 (compare 104) on the top surface of the substrate 202. The substrate may comprise a conventional silicon substrate used for semiconductor fabrication. The gettering layer 204 may be implanted using a conventional epitaxial process, such as by chemical vapor deposition (CVD), resulting in SiGe with 5-10% Ge, and may have a thickness of approximately 50~1000 nm. Carbon can be added in gas phase during CVD. Generally the deposition process is substantially the same for all embodiments described herein.

Figure 2B:
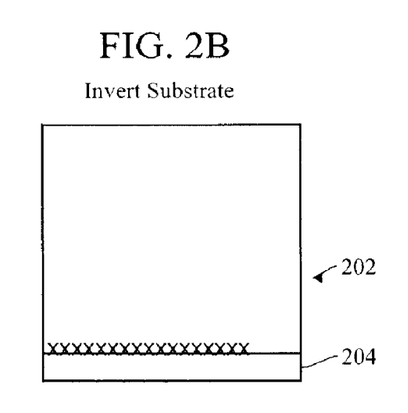

FIG. 2B illustrates a next step of the process. The substrate 102 is turned upside-down, so that the gettering layer 104 is on the backside of the substrate. Generally, instead of putting down epi Si for SIMOX process as in the previous (first) embodiment, the wafer is flipped and the other side of the wafer, which is single crystal silicon (native, rather than epi), is used to create the BOX.

Figure 2C:
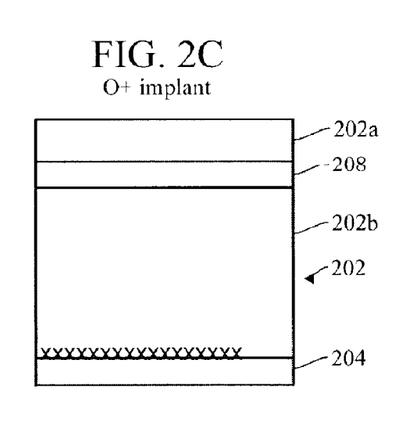

FIG. 2C illustrates a next step of the process. Oxygen (O+) is implanted (in what is now the front side of the substrate), using a conventional oxygen ion beam implantation process, to create a buried SiO2 (oxide) layer 108. This is similar to the step described with respect to FIG. 1C, except that the O+ implant is in the native substrate rather than in an epi layer.

Figure 2D:
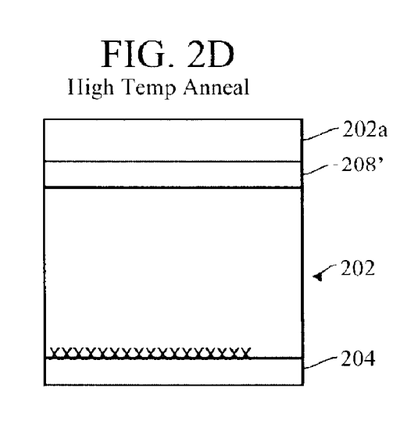

The layer 208 is located below the top (as viewed, formerly bottom) surface of the substrate 202, within the bulk of the substrate 202, resulting in a situation where there is a top silicon layer 202a, under which is the buried oxide layer or oxygen-rich region 208, under which is another silicon layer 202b. The top silicon layer 202a constitutes the "silicon" of silicon-on-insulator (SOI). The following dimensions are exemplary:
   top silicon layer 202a thickness=approximately 30-300 nm
   buried oxide layer 208 thickness=approximately 100-1000 nm
   bottom silicon layer 202b thickness=approximately 700-800 μm, or more FIG. 2D illustrates a next step of the process. The wafer is subjected to high temperature anneal, such as using a conventional annealing process, resulting in a buried oxide (BOX) layer 208' (prime) which constitutes the "insulator" of silicon-on-insulator (SOI). The anneal functions substantially as described in the previous embodiment.

FIGS. 3A-3D illustrate a sequence of steps (and resulting structures), involved in forming a gettering layer under the buried oxide (BOX) of a bonded silicon-on-insulator (SOI) wafer, according to an embodiment of the invention.

Figure 3A:
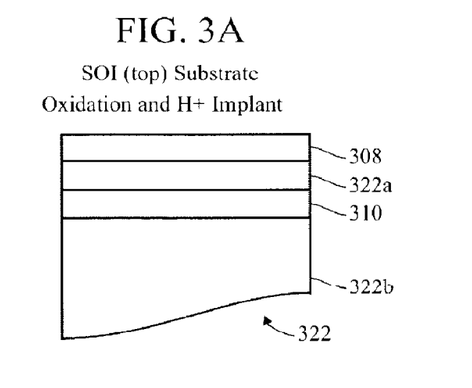
FIGS. 3A-3D are cross-sectional views of an embodiment of the invention.

FIG. 3A illustrates a "donor" substrate 322 which will provide the "active" silicon layer for forming devices (not shown) in the resulting SOI substrate. The substrate may comprise a conventional silicon substrate used for semiconductor fabrication.

Figure 3B:
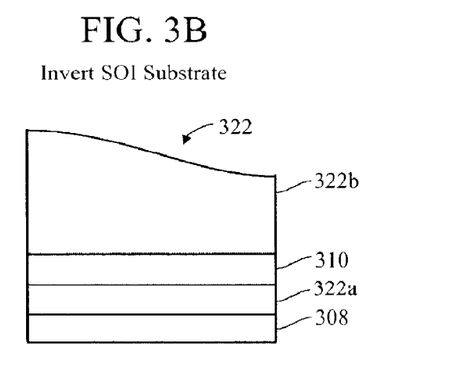
Figure 3C:
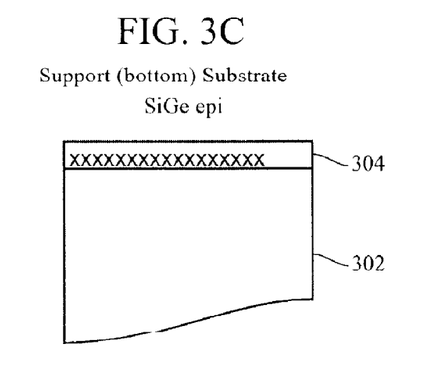
Figure 3D:
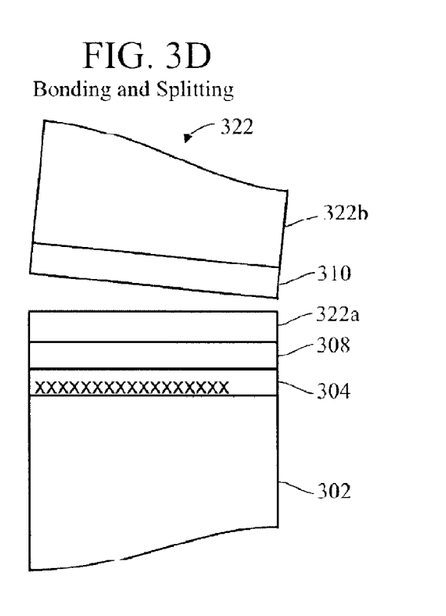

Surface oxidation is performed, using a conventional thermal oxidation process, such as at approximately 1000 degree-C., resulting in a top layer 308 (compare 108, 208) of silicon dioxide ($SiO_2$), which will become the BOX (FIG. 3D). It should be noted that this oxidation process is different than the O+ implants that were described with respect to FIGS. 1C and 2C.

A hydrogen (H+) implant is performed, using a conventional implantation or plasma immersion ion implantation process, resulting in a buried layer, or hydrogen-rich region 310. Thus, there is an oxide layer 308, under which is a layer 322a of substrate material, under which is a hydrogen-rich layer 310, under which is the remainder 322b of the substrate 322. The following dimensions are exemplary:

oxide layer 308 thickness=approximately 50-5000 nm
substrate layer 322a thickness=approximately 50-200 nm
hydrogen-rich layer 310 thickness=approximately 100-500 nm
remaining substrate 322b thickness=approximately 700-800 μm The use of hydrogen implantation for forming a cleaving plane for layer exfoliation (or transfer) is known, and is discussed, for example, in the aforementioned U.S. Pat. No. 7,202,124 and U.S. Pat. No. 7,183,179.

FIG. 3B illustrates the substrate of FIG. 3A in an inverted position, in preparation for bonding to a support substrate. The layer 310 will be used for separating the active silicon layer 322b from the bulk silicon 322a (see FIG. 4D). In contrast to the previous embodiments, no high temperature anneal should be performed at this stage, since it could result in H2 bubbles developing, and the surface layer (oxide and thin Si) would peel off. Generally, an anneal step would be performed only after bonding this wafer on to a handle wafer.

FIG. 3C illustrates a "support" substrate ("handle wafer") 302 (compare 102, 202) upon which a gettering layer 304 (compare 104, 204) is epitaxially formed. The substrate may comprise a conventional silicon substrate used for semiconductor fabrication. The gettering layer 304 may be formed using a conventional epitaxial process, such as by chemical vapor deposition (CVD), resulting in SiGe with 5-10% Ge, and may have a thickness of approximately 50~1000 nm. Carbon can be added in gas phase during CVD. Generally the deposition process is substantially the same for all embodiments described herein.

FIG. 3D illustrates formation of the bonded SOI wafer from the two substrates 322 and 302. The inverted substrate 322 is bonded (joined), face-to-face, with the support substrate 302, using a conventional bonding procedure, then is split therefrom, leaving behind (on the support substrate 302) the BOX layer 308 atop the gettering layer 304 (the gettering layer is under the BOX layer), and the "active" layer 322a of silicon atop the BOX layer 308. Note that the gettering layer 304 is disposed in the SOI substrate near the buried oxide layer 308. No anneal of the BOX is necessary, since it is formed by thermal oxidation from the beginning.

FIGS. 4A-4D illustrate a sequence of steps (and resulting structures), involved in forming a gettering layer on the backside (BOX) of a bonded silicon-on-insulator (SOI) wafer, according to an embodiment of the invention.

Figure 4A:
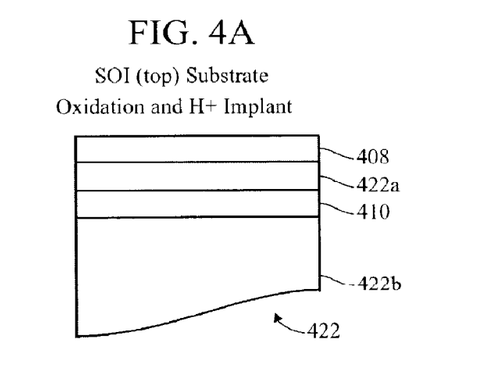
FIGS. 4A-4D are cross-sectional views of an embodiment of the invention.

FIG. 4A illustrates a "donor" substrate 422 which will provide the "active" silicon layer for forming devices (not shown) in the resulting SOI substrate. The substrate may comprise a conventional silicon substrate used for semiconductor fabrication. (Compare FIG. 3A)

Figure 4B:
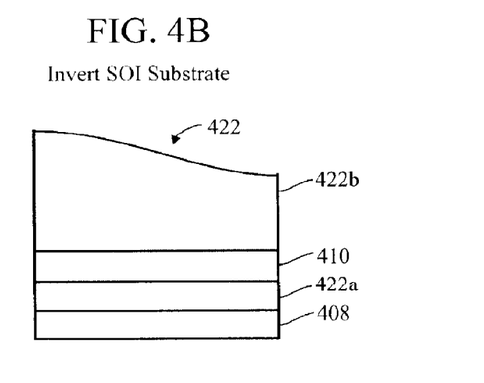
Figure 4C:
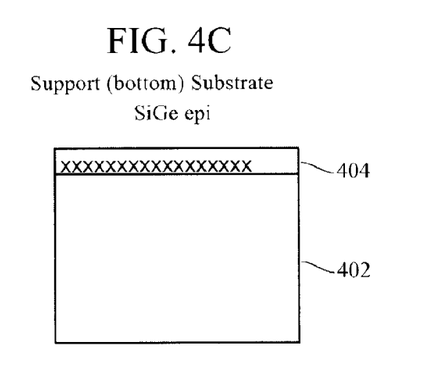
Figure 4D:
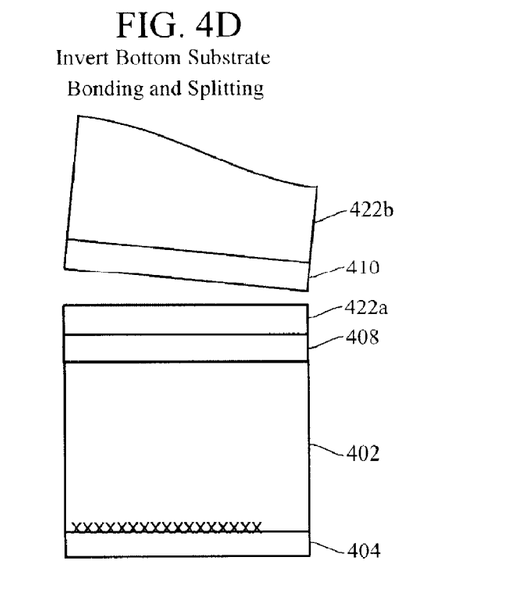

Surface oxidation is performed, using a conventional thermal oxidation process, such as at approximately 1000 degree-C., resulting in a top layer 408 (compare 108, 208, 308) of silicon dioxide ($SiO_2$), which will become the BOX (FIG. 4D). It should be noted that this oxidation process is different than the O+ implants that were described with respect to FIGS. 1C and 2C. A hydrogen (H+) implant is performed, using a conventional implantation or plasma immersion ion implantation process, resulting in a buried layer, or hydrogen-rich region 410. Thus, there is an oxide layer 408, under which is a layer 422a of substrate material, under which is a hydrogen-rich layer 410, under which is the remainder 422b of the substrate 422. The following dimensions are exemplary:

oxide layer 408 thickness=approximately 50-5000 nm
substrate layer 422a thickness=approximately 50-200 nm
hydrogen-rich layer 410 thickness=approximately 100-500 nm
remaining substrate 422b thickness=approximately 700-800 μm The use of hydrogen implantation for forming a cleaving plane for layer exfoliation (or transfer) is known, and is discussed, for example, in the aforementioned U.S. Pat. No. 7,202,124 and U.S. Pat. No. 7,183,179.

FIG. 4B illustrates the substrate of FIG. 4A in an inverted position, in preparation for bonding to a support substrate. The layer 410 will be used for separating the active silicon layer 422b from the bulk silicon 422a (see FIG. 4D). As discussed hereinabove, with respect to FIG. 3B, no high temperature anneal is required at this stage.

FIG. 4C illustrates a "support" substrate 402 (compare 102, 202, 402) upon which a gettering layer 404 (compare 104, 204) is epitaxially formed. The substrate may comprise a conventional silicon substrate used for semiconductor fabrication. The gettering layer 404 may be formed using a conventional epitaxial process, such as by chemical vapor deposition (CVD), resulting in SiGe with 5-10% Ge, and may have a thickness of approximately 50-1000 nm. Carbon can be added in gas phase during CVD. Generally the deposition process is substantially the same for all embodiments described herein.

FIG. 4D illustrates formation of the bonded SOI wafer from the two substrates 422 and 402. First, the support substrate 402 is inverted so that the gettering layer 404 will be on the backside of the resulting SOI wafer. Then (similar to the example illustrated in FIG. 3D), the inverted substrate 422 is bonded (joined), face-to-face, with the support substrate 402, using a conventional bonding procedure, then is split therefrom, leaving behind (on the support substrate 402) the BOX layer 408 atop native silicon of the support substrate 402, the "active" layer 422a of silicon atop the BOX layer 408, and the gettering layer 404 on the backside of the SOI wafer.

FIGS. 5A-5D illustrate a sequence of steps (and resulting structures), involved in forming a gettering layer under the buried oxide (BOX) of a seeded silicon-on-insulator (SOI) wafer, according to an embodiment of the invention.

Figure 5A:
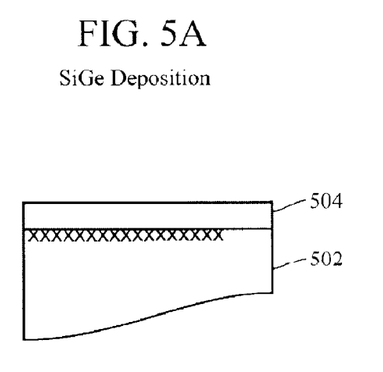
FIGS. 5A-5D are cross-sectional views of an embodiment of the invention.

FIG. 5A illustrates a first step of the process. SiGe is deposited (epitaxially) on a substrate 502, forming a gettering layer 504 on the top surface of the substrate 502. The substrate may comprise a conventional silicon substrate used for semiconductor fabrication, such as n/p type and 200/300 mm. The gettering layer 504 may be formed using a conventional epitaxial process, such as by chemical vapor deposition (CVD), resulting in SiGe with 5-10% Ge, and may have a thickness of approximately 50-1000 nm. Carbon can be added in gas phase during CVD. Generally the deposition process is substantially the same for all embodiments described herein.

Figure 5B:
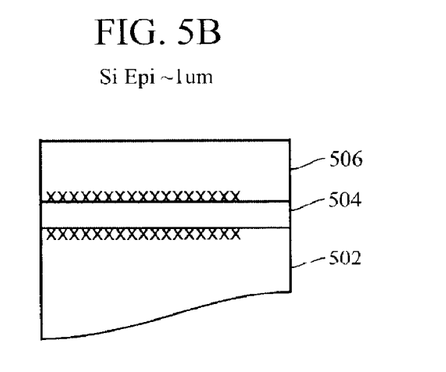

FIG. 5B illustrates a next step of the process. An epitaxial (epi) layer 506 of silicon (Si) is deposited, such as using a conventional chemical vapor deposition (CVD), with silicon gas species, resulting in approximately 1 µm thickness of single crystalline epi silicon.

Figure 5C:
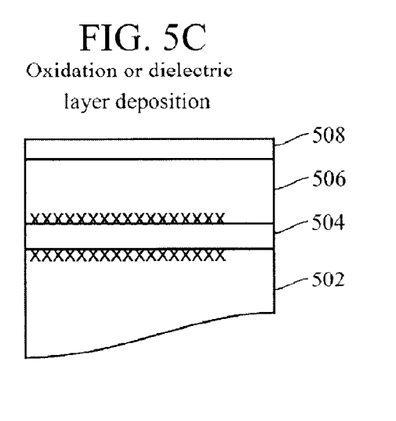

FIG. 5C illustrates a next step of the process. Oxidation or dielectric layer deposition is performed, to form a dielectric, such as SiO2 layer 508 on the top surface of the substrate 502, over (or within the surface of) the epi layer 506.

Figure 5D:
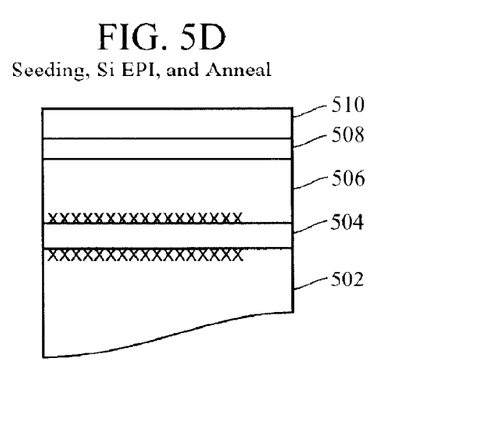

FIG. 5D illustrates next steps of the process. The wafer 502 is seeded, a layer 510 of silicon is epitaxially grown over the dielectric layer 508, and the wafer is subjected to high temperature anneal.

Figure 6A:
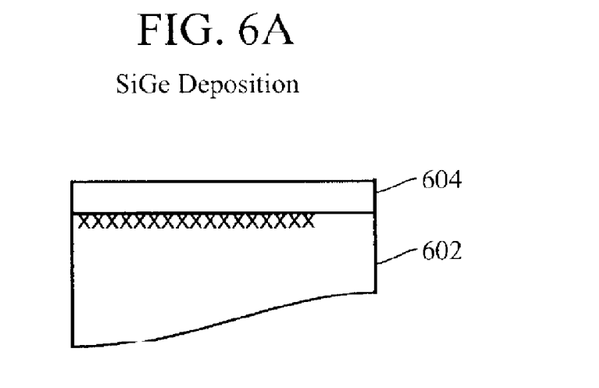
FIGS. 6A-6C are cross-sectional views of an embodiment of the invention.
Figure 6B:
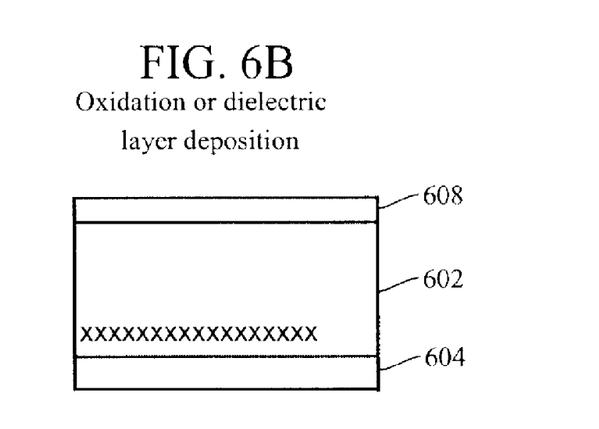
Figure 6C:
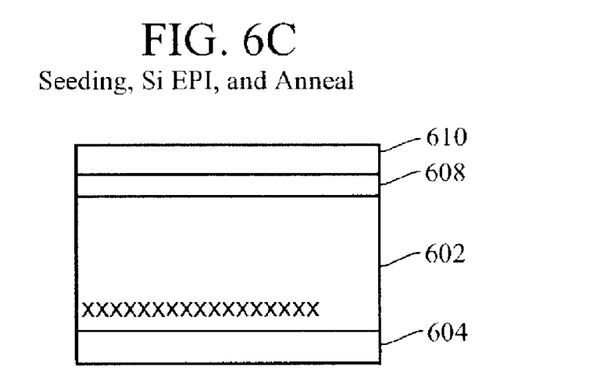

FIGS. 6A-6C illustrate a sequence of steps (and resulting structures), involved in forming a gettering layer on the backside of a seeded silicon-on-insulator (SOI) wafer, according to an embodiment of the invention.

FIG. 6A illustrates a first step of the process. SiGe is deposited (epitaxially) on a substrate 602, forming a gettering layer 604 on the top surface of the substrate 602. The substrate may comprise a conventional silicon substrate used for semiconductor fabrication, such as n/p type and 200/300 mm. The gettering layer 504 may be formed using a conventional epitaxial process, such as by chemical vapor deposition (CVD), resulting in SiGe with 5-10% Ge, and may have a thickness of approximately 50-1000 nm. Carbon can be added in gas phase during CVD. Generally the deposition process is substantially the same for all embodiments described herein.

FIG. 6B illustrates a next step of the process. The substrate 602 is inverted. Oxidation or dielectric layer deposition is performed, to form a dielectric, such as SiO2 layer 608 on the backside (top, as viewed) of the substrate 602.

FIG. 6C illustrates next steps of the process. The wafer 602 is seeded, a layer 610 of silicon is epitaxially grown, and the wafer is subjected to high temperature anneal.

In the examples described hereinabove, the gettering layer (102, 204, 304, 404, 504, 604) comprises SiGe and may have carbon atoms may be added to SiGe to stabilize the dislocation network.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of making an SOI substrate comprising:
   providing a substrate;
   epitaxially growing a thin film gettering layer on the substrate, the gettering layer comprising a dislocation network, the gettering layer comprising silicon-germanium (SiGe) having 5-10% Ge and a having thickness of approximately 50~1000 nm; and
   stabilizing the dislocation network by adding carbon atoms to the SiGe.

2. The method of claim 1 further comprising:
   depositing a silicon epi layer over the gettering layer;
   implanting an oxygen-rich region within the epi layer; and
   performing annealing.

3. The method of claim 1 further comprising:
   inverting the substrate;
   implanting oxygen in the substrate; and
   performing annealing.

4. The method of claim 1, wherein the substrate is a first substrate, further comprising:
   in a second substrate, oxidizing a top layer of the substrate, and forming a hydrogen-rich separation layer which is below a substrate layer which is below the oxidized top layer; and
   inverting the second substrate and bonding it face-to-face with the first substrate, splitting the second substrate from the first substrate at the separation layer.

5. The method of claim 1, wherein the substrate is a first substrate, further comprising:
   in a second substrate, oxidizing a top layer of the second substrate, and forming a hydrogen-rich separation layer which is below a substrate layer which is below the oxidized top layer;
   inverting the first substrate; and
   inverting the second substrate and bonding it face-to-face with the first substrate, splitting the second substrate from the first substrate at the separation layer.

6. The method of claim 1 further comprising:
   depositing a silicon epi layer over the gettering layer;
   forming a dielectric layer over the epi layer;
   performing seeding, epitaxially growing a layer of silicon over the dielectric layer; and
   subjecting the substrate to high temperature anneal.

7. The method of claim 1 further comprising:
   inverting the substrate;
   implanting oxygen in the substrate; and
   performing annealing.

8. The method of claim 5, wherein oxidizing a top layer of the second substrate is performed via a thermal oxidation process.

9. The method of claim 5, wherein forming a hydrogen-rich separation layer is performed with a plasma immersion ion implantation process.

\* \* \* \* \*